(12) United States Patent
Shapiro

(10) Patent No.: US 7,869,539 B2
(45) Date of Patent: Jan. 11, 2011

(54) METHODS, SYSTEMS, AND COMPUTER PROGRAM PRODUCTS FOR RATELESS CODING

(75) Inventor: Jerome Mark Shapiro, Belmont, MA (US)

(73) Assignee: The Mitre Corporation, McLean, VA (US)

( * ) Notice: Subject to any disclaimer, the term of this patent is extended or adjusted under 35 U.S.C. 154(b) by 547 days.

(21) Appl. No.: 11/971,031

(22) Filed: Jan. 8, 2008

(65) Prior Publication Data

US 2008/0165889 A1 Jul. 10, 2008

Related U.S. Application Data

(60) Provisional application No. 60/879,043, filed on Jan. 8, 2007.

(51) Int. Cl.
 *H04L 27/00* (2006.01)
(52) U.S. Cl. .................... 375/295; 375/285; 375/296
(58) Field of Classification Search ............... 375/295, 375/296, 285
See application file for complete search history.

(56) References Cited

U.S. PATENT DOCUMENTS 7,653,122 B2 * 1/2010 Siriwongpairat et al. .... 375/146
7,782,964 B1 * 8/2010 Talley et al. ................ 375/260

OTHER PUBLICATIONS

U. Erez, G.W. Wornell and M.D. Trott, "Faster-than-Nyquist Coding: The Merits of a Regime Change," in Proc. Allerton Conf. Commun., Contr., and Computing, (Illinois), Oct. 2004.

* cited by examiner

*Primary Examiner*—Ted M Wang
(74) *Attorney, Agent, or Firm*—Sterne, Kessler, Goldstein & Fox P.L.L.C.

(57) ABSTRACT

The disclosed methods, systems, and computer-program products for compute a power allocation for a rateless, error-correcting code constructed from a plurality of repeated blocks having a plurality of superimposed layers and having a decoding signal-to-noise ratio (SNR) threshold. A noise threshold for an initial block of the rateless code is determined based on at least the SNR threshold, and a power allocation for each layer of the initial block is then calculated based on the determined noise threshold. The calculated power allocation may ensure that each layer of the initial block experiences the SNR threshold. Power is then allocated to each layer of a block proximate to the initial block such that each layer of the proximate block has an effective SNR equivalent to the SNR threshold. The allocating step for the proximate block is then repeated for each of the plurality of repeated blocks subsequent to the initial block to allocate power to each layer of the plurality of repeated blocks.

31 Claims, 6 Drawing Sheets

METHODS, SYSTEMS, AND COMPUTER PROGRAM PRODUCTS FOR RATELESS CODING

CROSS-REFERENCE TO RELATED APPLICATIONS

This application claims priority to U.S. Provisional Patent Application No. 60/879,043, filed Jan. 8, 2007, which is hereby incorporated by reference in its entirely.

FIELD OF THE INVENTION

The present invention relates to wireless communication systems. More particularly, the present invention relates to rateless codes for use in wireless communications systems.

BACKGROUND OF THE INVENTION

Conventional wireless communications systems typically include one or more transmitters that operate in conjunction with one or more receivers. In general, transmitters process information bits with an error detection code, such as a cyclic-redundancy check (CRC) code, that appends a small number of bits to the information bits to the information packet. The information packet is then processed with an error correcting code, such as a turbo code or low density parity check code (LDPC), to form a coded packet. The transmitter then modulates, or maps, these coded bits onto a stream of symbols, such as Quadrature Amplitude Modulation. The symbol stream forms a complex baseband signal that is then up-converted to an RF frequency and transmitted over a channel.

The receiver obtains a signal and performs the inverse process of down-converting, demodulating, and decoding. Since the wireless channel may distort and attenuate the transmitted signal, there is some probability that the decoded bits are incorrect and, using the CRC, a receiver can determine with high probability whether the information bits are correct. The process that sends information bits between the transmitter and receiver is widely known as the physical layer and includes all of the RF, modulation and/or demodulation, and error-correcting and/or detection coding.

The process by which transmitters and receivers communicate a status of a data transfer is widely known as the data link layer. In conventional wireless systems, a receiver sends an acknowledgment (ACK) message to a transmitter using the reverse link physical layer if the received information bits are correct. If, however, the message was not received correctly, the receiver sends a (NACK) message to the transmitter. In conventional data communication systems, the transmitter receiving a NACK message would initiate an automatic repeat request (ARQ), and the transmitter would attempt to resend the message.

As the quality of wireless channel varies widely, "non-rateless" systems must generally be designed for a specific range of operating conditions, and as such, a fair amount of design margin is needed to ensure reliability. Therefore, when the channel quality is good, the transmitted data rate is often far lower than the channel could support, and when the channel quality is bad, the message does not get through to the receiver, so the transmitted power is wasted.

The goal of rateless coding is to design a scheme that, by virtue of its protocol, modulation and coding scheme, may be implemented by a wireless communications system to automatically adapt to the changing channel conditions, thus ensuring a high data rate when channel conditions are good and a low data rate when channel conditions are poor. In either case, a wireless system using rateless coding wastes little or no transmitted power. The benefit of such a rateless coding is that no margin needs to be designed into the system, and as such, the system can operate opportunistically and achieve a rate commensurate with the instantaneous channel conditions.

SUMMARY OF THE INVENTION

Accordingly, the present disclosure introduces method, system, and computer-program product embodiments for computing a power allocation for a rateless, error-correcting code constructed from a plurality of repeated blocks having a plurality of superimposed layers and having a decoding signal-to-noise ratio (SNR) threshold.

According to an embodiment, a noise threshold for an initial block of the rateless code is determined based on at least the SNR threshold, and a power allocation for each layer of the initial block is then calculated based on the determined noise threshold. In an embodiment, the calculated power allocation ensures that each layer of the initial block experiences the SNR threshold. Power is then allocated to each layer of a block proximate to the initial block such that each layer of the proximate block has an effective SNR equivalent to the SNR threshold. In an embodiment, the power allocation process for the proximate block first identifies an upper and a lower bound on noise threshold for the proximate block and iteratively determines a noise threshold and a power allocation for the proximate block by searching between the identified upper and lower bounds. The allocating step for the proximate block is then repeated for each of the plurality of repeated blocks subsequent to the initial block to allocate power to each layer of the plurality of repeated blocks.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein

DESCRIPTION OF THE DRAWINGS

The present invention is described with reference to the accompanying drawings. The accompanying drawings, which are incorporated herein and form a part of the specification, illustrate embodiments of the present invention and, together with the description, further serve to explain the principles of the invention and to enable a person skilled in the relevant art to make and use the invention.

Figure 1:
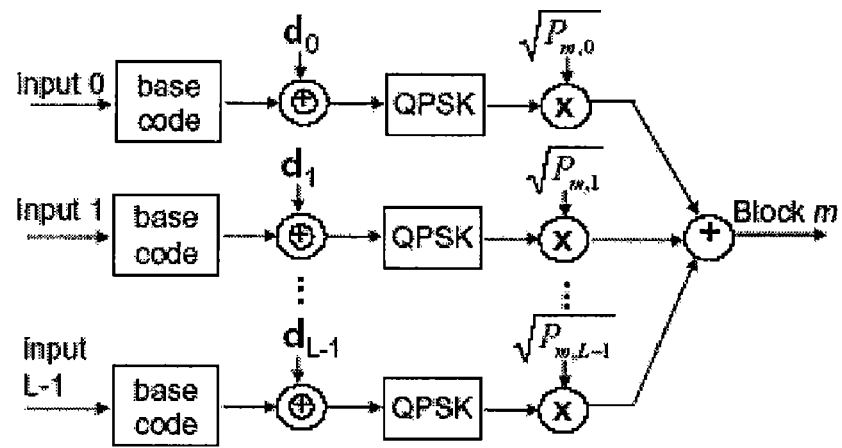
FIGS. 1 and 2 depict features of an exemplary rateless, error-correcting code constructed from a plurality of repeated blocks having a plurality of superimposed layers.

The present invention will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Introduction

Rateless codes are good codes whose codeword prefixes themselves form good codes. Such codes have recently received increased attention from the research community, in large part because they are attractive for use over channels with unpredictable channel characteristics (e.g., in many wireless environments). Using rateless codes, a transmitter only needs to transmit as much of the codeword as is necessary to decode, in effect making the code rate itself variable in response to the variability in the channel. Rateless codes allow the system designer to leave out link margin requirements, because the rateless codes themselves adapt to changing channel conditions.

Well-known rateless codes include those known as fountain codes, which are designed for the application layer and erasure channel models (see, for example, those rateless codes discussed in A. Shokrollahi, "Raptor Codes," IEEE Trans. Info. Th., vol. 52, pp. 2551-2567, June 2006). However, the rateless codes discussed in the embodiments and examples below are closer in spirit to hybrid-ARQ (H-ARQ) systems familiar in many wireless standards.

The embodiments and examples below describe methods, systems, and computer program products for computing a power allocation for a rateless, error-correcting code. Examples of such codes include, but are not limited to, the rateless codes described by Erez, et al. in "Rateless Coding and Perfect Rate-Compatible Codes for Gaussian Channels," Proc. Int. Symp. Inform. Theory (ISIT), (Seattle, Wash.), pp. 528-532, July 2006.

Figure 2:
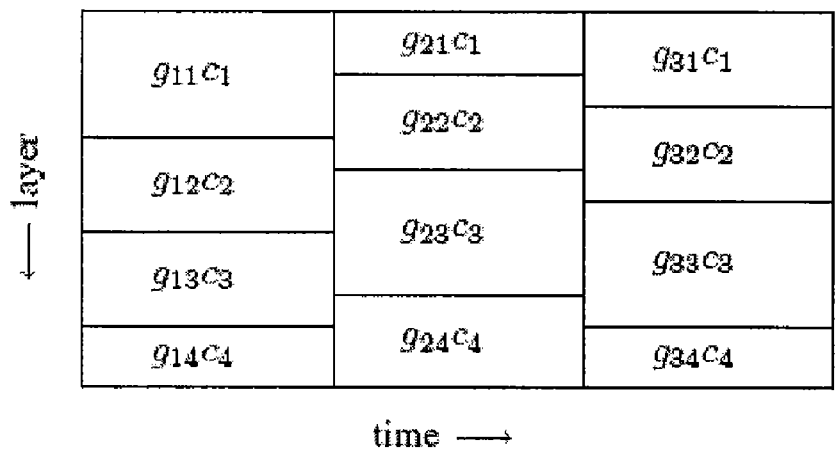

FIGS. 1 and 2 depict features of the exemplary rateless block code described by Erez, et al. Using the code construction of Erez, et al., a packet of information bits is divided into L layers, each of which is encoded using a base code of rate R (which is the same for all layers), dithered, modulated, and weighted by a derived amplitude. For example, FIG. 1 depicts a process for encoding information using the rateless block code construction of Erez, et al., in which $d_0, d_1, \ldots, d_{L-1}$ are binary dither sequences. Further, for example, FIG. 2 depicts the rateless code construction of Erez, et al. having four layers and three blocks of redundancy. In the exemplary construction of FIG. 2, each block is a weighted linear combination of the base codewords $c_1, c_2, \ldots, c_4$, where $g_{ml}$ denotes the weight for layer l of block m incorporating the effect of dithering and power allocation.

The layers are then superimposed to form one redundancy block of the rateless code, and the block is then sent over the channel. If the receiver can decode this block, the receiver sends an acknowledgement (ACK). If the receiver is unable to decode the block, then the receiver either sends a no-acknowledgement (NACK) or there is time-out, and the transmitter sends the information again in a new redundancy block, encoding the same layers as before and using the same base codes, but with different power allocation and dithering in the superposition.

The receiver then computes the channel log-likelihood ratios for soft-decision decoding by employing successive decoding with maximal ratio combining (MRC). Specifically, MRC is applied to the first layer of the set of received blocks, treating the other layers as, for example, white Gaussian noise. If this first layer can be decoded, its contribution to all blocks is cancelled (i.e., removed), and decoding proceeds to the second layer. MRC and successive cancellation are now used on this second layer, and so on, until all layers are successfully decoded, at which time the receiver sends an ACK.

Erez, et al., have demonstrated that, when used in conjunction with capacity-achieving binary base codes of sufficiently low rate, a particular layer-dither repeat architecture is sufficient to come within any desired fraction of capacity on a realized channel. While the fundamental modulation scheme of Erez, et al., is realizable, the particular conditions under which protocol of Erez, et al., was designed make assumptions that are only asymptotically true. For example, the power allocation scheme of Erez, et al. assumes that the actual underlying error correcting code achieves capacity (Claude Shannon derived a term called "capacity" which is the upper bound on the data rate achievable for a certain "channel condition"). However, in reality, no such capacity-achieving code exists. Further, power allocation scheme of Erez, et al., assumes that a capacity-optimal combining scheme is used to combine the information from repeated transmissions of the same information. In reality, no such capacity-optimal combining scheme exists. As a result, the power allocation described by Erez, et al. produces encodings where the receiver cannot decode at the expected SNR levels, and therefore, the design protocol of Erez, et al., results in poor actual performance because a real system cannot quite achieve their assumptions.

Therefore, what is needed is method, systems, and computer program products for computing a power allocation for use with practical rateless codes that fail to achieve capacity and that utilize realistic combining schemes.

Figure 3:
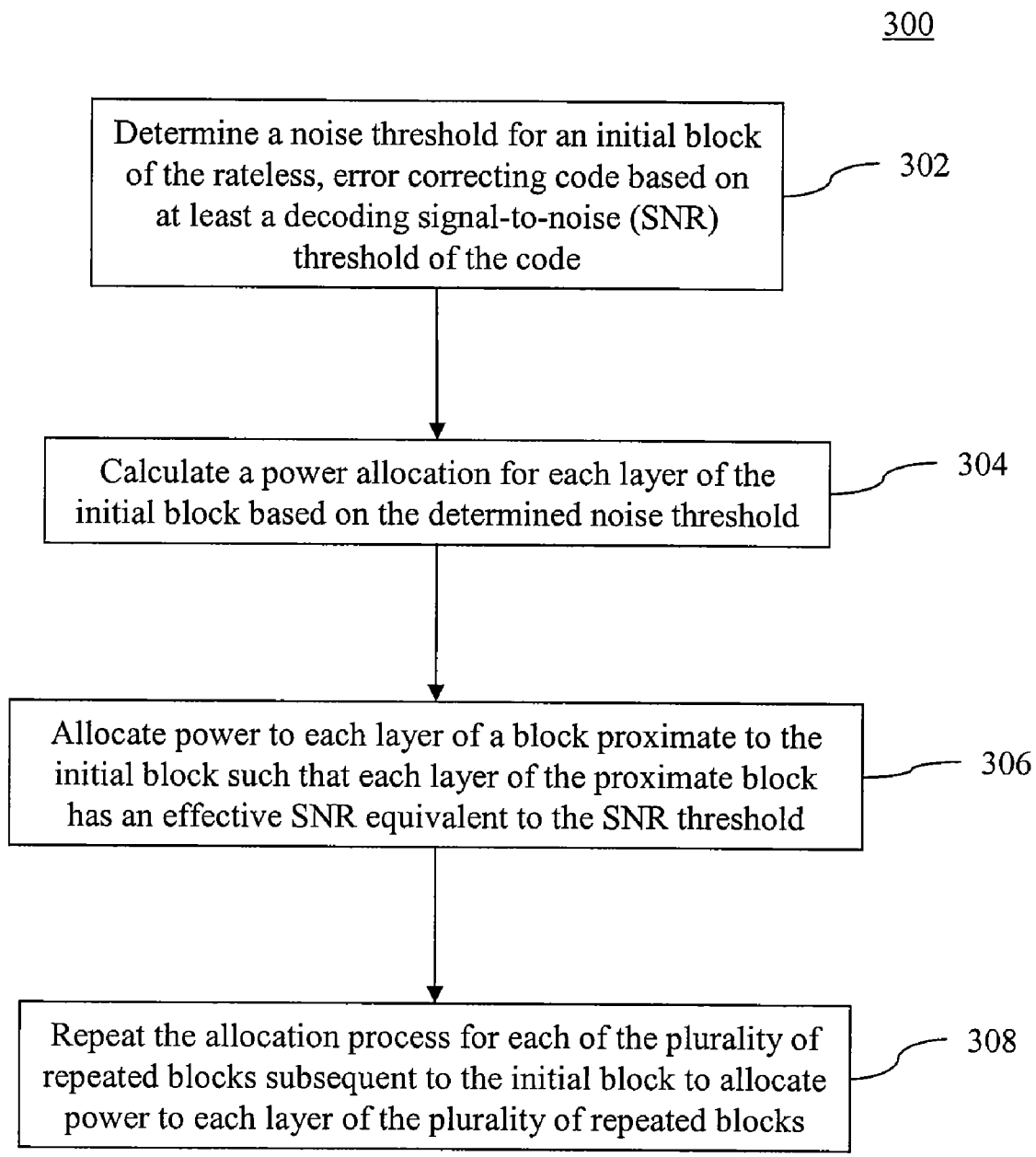
FIG. 3 depicts an exemplary method for computing a power allocation for a rateless, error-correcting code.

Exemplary Methods for Computing Power Allocation for a Rateless, Error-Correcting Code FIG. 3 is a detailed overview of an exemplary method 300 for computing a power allocation for a rateless, error-correcting code. In the embodiment of FIG. 3, the rateless, error-correcting code is constructed from a plurality of repeated blocks having a plurality of repeated layers and having a decoding signal-to-noise (SNR) threshold. However, the exemplary method 300 is not limited to such any specific layered, rateless code, and in additional embodiments, the exemplary method 300 may be applied to compute a power allocation for any of a variety of layered, rateless codes that would be apparent to one skilled in the art.

In step 302, a noise threshold is determined for an initial block of the rateless code based on at least the SNR threshold of the code. Step 304 then utilizes the determined noise threshold to calculate a power allocation for each layer of the initial block. In one embodiment, the calculated power allocation for each layer of the initial block ensures that the each layer of the initial block experiences the same SNR threshold.

The power allocation for each layer of the initial block may be computed in step 304 by first allocating power to an upper layer of the initial block based on the SNR threshold and the noise threshold of the initial block. In one embodiment, step 304 may compute a product of the noise threshold for the initial block and the SNR threshold when allocating power to the upper layer of the initial block. Once power is allocated to the upper layer of the initial block, step 304 may then recursively calculate the power allocated to each layer of the initial block below that upper layer, e.g., the power allocation for a layer l is based on the power allocated to higher layers (e.g., l+1, ..., L−1).

However, the power allocation process in step 304 is not limited to recursive computing the power allocation for each layer of the initial block below the upper layer. In additional embodiments, step 304 may first allocate power to a lower layer of the proximate block and may then compute the power allocation for each layer of the initial block above that lower layer using the power previously-allocated to the lower layers, i.e., the power allocation for a layer l is based on the power allocated to lower layers (e.g., 0, ..., l−1).

Once the noise threshold and power allocation have been computed for the initial block, power is then allocated in step 306 to each layer of a block proximate to the initial block. The power allocated to each layer of the proximate block in step 306 ensures that each layer of the proximate block has an effective SNR equivalent to the threshold SNR. Subsequently, in step 308, the power allocation process of step 306 is repeated for each of the plurality of repeated blocks subsequent to the initial block to allocate power to each layer of the plurality of repeated blocks.

In an additional embodiment, exemplary method 300 may compute a log-likelihood ratio (LLR) of a coded bit of information at each layer of each block of the plurality of blocks of the rateless code. The computation of the LLRs for the coded bits of information may, in additional embodiments, facilitate the computation of effective and residual SNRs for each layer of the plurality of blocks under the assumption that the code employs maximal ratio combining (MRC).

Figure 4:
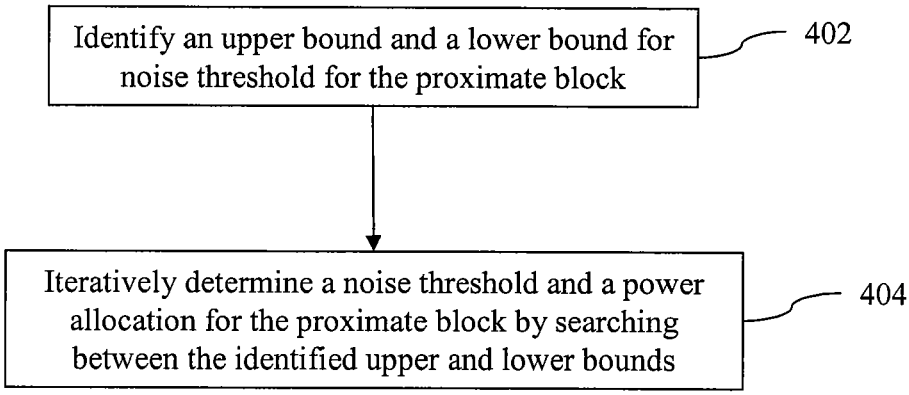
FIG. 4 depicts an example method for allocating power to a block proximate to an initial block of a rateless, error-correcting code that may be incorporated into the exemplary method of FIG. 3.

FIG. 4 depicts an method 400 for computing a power allocation for each layer of a proximate block that may be incorporated into the exemplary method of FIG. 3. In step 402, an upper bound and a lower bound on noise threshold are identified for the proximate block. In one embodiment, the lower bound may correspond to a noise threshold for an adjacent, lower block, and the upper bound may represent a noise threshold for a capacity-achieving code. However, the exemplary method 400 is not limited to such upper and lower bounds, and in additional embodiments, various upper and lower bound on the noise threshold of the proximate block may be selected without departing from the sprit or scope of the present invention. For example, in an embodiment, an upper bound may be selected that is larger in magnitude than the noise threshold for the proximate block, but smaller in magnitude that the noise threshold of the capacity achieving code.

A noise threshold and a power allocation for the proximate block are then iteratively determined in step 404 by searching between the identified upper and lower bounds. In one embodiment, a search technique may employ the upper and lower bounds as starting estimates and may converge to the noise threshold for the proximate block. The power allocation for the proximate block may then be iteratively computed from the converged noise threshold for the proximate block. In an additional embodiments, step 404 may compute an optimal noise threshold and an optimal power allocation for the proximate block.

Figure 5:
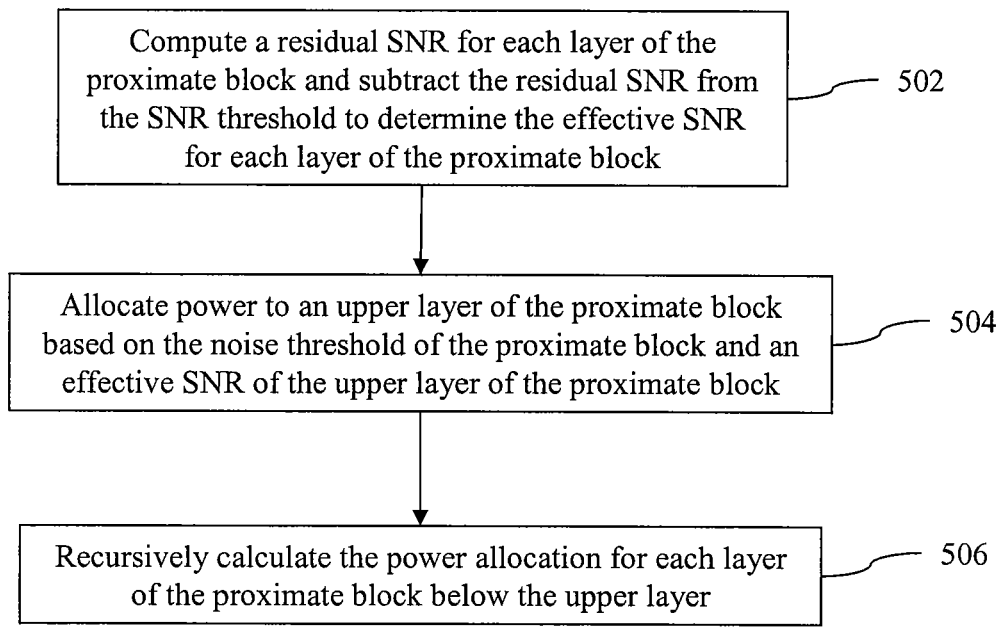
FIG. 5 depicts an example method for iteratively determining a power allocation for a rateless code that may be incorporated into the exemplary method of FIG. 4.

FIG. 5 illustrates a method 500 for determining a power allocation for the proximate block that may be incorporated into the exemplary method of FIG. 4. In step 502, a residual SNR is computed for each layer of the proximate block and, under the assumption that maximal ratio combining (MRC) is used to combine repeated blocks of the rateless code, the effective SNR of each layer of the proximate block is subsequently computed by subtracting the residual SNR for each layer of the proximate block from the threshold SNR.

The computation of the effective SNR in step 503 is not limited to rateless codes that utilize MRC to combine repeated code blocks. In additional embodiments, the effective SNR for each layer of the proximate block may be computed using a number of techniques and under a number of additional assumptions without departing from the spirit or scope of the present invention.

In step 504, power is allocated to an upper layer of the proximate block based on at least the determined noise threshold of the proximate block and the effective SNR of the upper layer of the proximate block. Once power has been allocated to the upper layer in step 504, the power allocation for each layer of the proximate block below the upper layer is computed in step 506. In the embodiment of FIG. 5, the power allocated to each layer below the upper layer is computed recursively, e.g., the power allocation for a layer l is based on the power allocated to higher layers (e.g., l+1, ..., L−1).

The determination of the power allocation for the proximate block, as described in step 504, is not limited to the recursive computation of the power allocation for each layer of the proximate block. In additional embodiments, step 504 may first allocate power to a lower layer of the proximate block and may then compute the power allocation for each layer of the proximate block above the lower layer using the power previously-allocated to the lower layers, i.e., the power allocation for a layer l is based on the power allocated to lower layers (e.g., 0, ..., l−1).

In an additional embodiment, the methods of FIGS. 3-5 may be incorporated into a wireless protocol that may be adopted by transmitters and receivers in a wireless communications system. In such an embodiment, the power allocated to each layer of the repeated blocks of the rateless code may be computed and included within the protocol. A transmitter and a receiver may be configured to operate in accordance with the protocol, and the calculation of the power allocation may be performed only once during the establishment of the protocol. In such an embodiment, the transmitter and receiver may operate according to the protocol without performing additional calculations of power allocation in real time.

EXAMPLE

Power Allocation and Implementation for Practical Rateless Codes for the Gaussian Channel The following example describes the implementation of rateless block codes, such as the rateless, layered block code of Erez, et al., when used in conjunction with practical base codes. In particular, the following example utilizes the methods described above with respect to FIGS. 3-5 and derives an appropriate power allocation for use when a base code of rate R is decodable only at a signal-to-noise ratio (SNR), $\rho$, that is somewhat higher than what a capacity-achieving code would require, i.e., $$\rho = (2^{2R_0} - 1)\Delta, \quad (1)$$

for some SNR gap $\Delta>1$ to capacity. The expression for the SNR makes the familiar simplifying assumption that the word-error rate curve is a perfect "cliff," i.e., that the decoder always decodes a codeword perfectly for SNRs greater than or equal to $\rho$ and fails to decode otherwise.

In the channel model of the following example, the received signal is, omitting the time index, y=x+z, where x is the channel input (transmitted signal) and z is the channel noise of variance N. In the following example, $N_m$ denotes a maximum noise threshold at which decoding is possible after receiving the $m^{th}$ block, and the corresponding (minimum) SNR threshold is $SNR_m = P/N_m$.

The transmission is limited to average power P, so for an encoding of L layers, the power constraint takes the form:

$$\sum_{l=0}^{L-1} P_{m,l} = P, \quad m = 1, 2, \ldots \quad (2)$$

where $P_{m,l}$ is the power allocated to the $l^{th}$ layer of the $m^{th}$ block.

A simple block-by-block iteration for calculating the optimal power allocation is developed, beginning with the first block.

I. Power Allocation for the First Block

For block m=0, the noise threshold $N_0$ and power allocation $P_{0,l}$, l=0, 1, ..., L−1, are computed such that each layer sees the same target SNR $\rho$ that will allow decoding of the chosen base codes. Specifically, $$\frac{P_{0,l}}{N_0 + \sum_{l'=l+1}^{L-1} P_{0,l'}} = \rho \quad (3)$$

for l = 0, 1, ..., L−1.

Rewriting in matrix form $$\begin{bmatrix} 1 & -\rho & -\rho & \cdots & -\rho \\ 0 & 1 & -\rho & \cdots & -\rho \\ \vdots & & \ddots & & \vdots \\ 0 & \cdots & 0 & 1 & -\rho \\ 1 & \cdots & \cdots & 1 & 0 \end{bmatrix} \begin{bmatrix} P_{0,0} \\ P_{0,1} \\ \vdots \\ P_{0,L-1} \\ N_0 \end{bmatrix} = \begin{bmatrix} 0 \\ 0 \\ \vdots \\ 0 \\ P \end{bmatrix} \quad (4)$$

and applying Gaussian elimination, we obtain $$N_0 = \frac{P}{(1+\rho)^L - 1} \quad (5)$$

$$P_{0,l} = \frac{\rho(1+\rho)^{L-l-1} P}{(1+\rho)^L - 1}, \quad l = 0, 1, \ldots, L-1. \quad (6)$$

A similar power allocation formula is developed by Warner, et al. in the context of multi-user CDMA (see, for example, Warner, et al., "On the Capacity of Cellular CDMA with Successive Decoding and Controlled Power Disparities," Proc. 48th IEEE Vehicular Technology Conf., vol. 3, pp. 1873-1877, May 1998).

The $P_{0,l}$ may be computed iteratively with l by first calculating $N_0$ as in Equation (5) and then proceeding via $$P_{0,L-1} = \rho N_0 \quad (7)$$

$$P_{0,l} = (1+\rho) P_{0,l+1}, \quad l = L-2, \ldots, 1, 0. \quad (8)$$

Note that rearranging Equation (5), a total rate in the transmission may be expressed in the form $$LR = L\frac{1}{2}\log(1+\rho) = \frac{1}{2}\log\left(1 + \frac{P}{N_0}\right), \quad (9)$$

which is the rate achievable by a capacity-achieving code over this channel when the noise level is $N_0$. Note that all logarithms are base 2 unless otherwise specified.

II. Gap to Capacity for the First Block

As described by Erez, et al., a layered rateless system using a capacity achieving base code approaches optimal efficiency in the limit of large L. In the following section, a counterbalancing effect is demonstrated, i.e., using a practical base code, the gap to capacity of Block 0 decoding increases monotonically with L. For this analysis, the ceiling rate R for the code is fixed, and the ceiling rate R is the rate achieved if the transmission is decodable from a single received block (for example, a typical target R is 4 b/s/Hz). Then, since $$R = LR_0, \quad (10)$$

varying L requires varying $R_0$ to keep R fixed. From Equation (5), a SNR threshold for successful decoding is obtained after a single block as $$SNR_L = (1+\rho)^L - 1 \quad (11)$$

which, substituting for $\rho$ via Equation (1) and using Equation (10), yields $$SNR_L = (1 + \Delta(2^{2R/L} - 1))^L - 1. \quad (12)$$

The corresponding SNR with a capacity-achieving code is obtained by setting $\Delta=1$ in Equation (12) and recognizing that the result is invariant to L, thus yielding $2^{2R}-1$. Hence, the overall gap to capacity is a scaled version of Equation (12):

$$\Delta_L = \frac{(1 + \Delta(2^{2R/L} - 1))^L - 1}{2^{2R} - 1}. \quad (13)$$

It is straightforward to verify, using the convenient monotonic transformation $$r_L = \ln(1 + SNR_L) \quad (14)$$

that $SNR_L$, as defined in Equation (12), converges to $$\lim_{L \to \infty} SNR_L = 2^{\Delta 2R} - 1, \quad (15)$$

whence $$\lim_{L \to \infty} \Delta_L = \frac{2^{\Delta 2R} - 1}{2^{2R} - 1}. \quad (16)$$

Moreover, $\Delta_L$, as given in Equation (16), increases monotonically in L. To see this result, it suffices to first note that 1) the second derivative of Equation (14) is negative:

$$\frac{d^2 r_L}{dL^2} = -\frac{4(\ln 2)^2 \Delta(\Delta-1)R^2 2^{2R/L}}{L^3(1+\Delta(2^{2R/L}-1))^2} < 0, \quad (17)$$

which follows from simple calculus; and 2) $r_L$ converges as $L \to \infty$ (for example, compare with Equation (15)). Hence, $r_L$ increases monotonically, and since $r_L$ is a monotonic function of $SNR_L$, so must $SNR_L$.

III. Power Allocation for the $m^{th}$ Block

The following section computes an optimal power allocation for the layers within block m, taking into account the use of maximal ratio combining (MRC). Since the power allocation will be generated iteratively in m, the following section assumes the optimum power allocation for blocks $0, 1, \ldots, m-1$ has been determined.

With MRC, SNRs add, so the total post-combining SNR seen by layer l after the cancellation of lower layers is the sum of SNRs for the individual redundancy blocks:

$$SNR_l(N_m) = \sum_{m'=0}^{m} SNR_{m',l}(N_m), \quad (18)$$

where $$SNR_{m',l}(N_m) = \frac{P_{m',l}}{\sum_{l'=l+1}^{L-1} P_{m',l'} + N_m}. \quad (19)$$

When going from m−1 blocks to m blocks, the noise threshold increases from $N_{m-1}$ to $N_m$, and thus the per-layer per-block SNRs all decrease. The new ($m^{th}$) redundancy block must make up for this SNR shortfall to enable decoding. Since MRC is used, the SNR that must be contributed by this $m^{th}$ block is simply calculated as $$SNR_{m,l}(N_m) = \rho - \sum_{m'=0}^{m-1} SNR_{m',l}(N_m), \quad (20)$$

for $l=0, 1, \ldots, L-1$, and thus L linear equations are obtained:

$$P_{m,l} - \rho_{m,l}\left(\sum_{l'=l+1}^{L-1} P_{m,l'} + N_m\right) = 0. \quad (21)$$

where, for convenience, the right hand side of Equation (20) is denoted by $\rho_{m,l}$. The shortfall equations (21) and the power constraint of Equation (2) can together be written in matrix form $$\begin{bmatrix} 1 & -\rho_{m,0} & -\rho_{m,0} & \cdots & -\rho_{m,0} \\ 0 & 1 & -\rho_{m,1} & \cdots & -\rho_{m,1} \\ \vdots & & \ddots & & \vdots \\ 0 & \cdots & 0 & 1 & -\rho_{m,L-1} \\ 1 & \cdots & \cdots & 1 & 0 \end{bmatrix} \begin{bmatrix} P_{m,0} \\ P_{m,1} \\ \vdots \\ P_{m,L-1} \\ N_m \end{bmatrix} = \begin{bmatrix} 0 \\ 0 \\ \vdots \\ 0 \\ P. \end{bmatrix} \quad (22)$$

Applying Gaussian elimination and (sub)iteration over l, an expression for $N_m$ takes the form $$N_m = \frac{P}{\prod_{l'=0}^{L-1}(1+\rho_{m,l'})-1}, \quad (23)$$

and the calculation of the power allocated to layer l of block m then proceeds from $l=L-1$ down to $l=0$ via $$P_{m,l} = \rho_{m,l}\left(\sum_{l'=l+1}^{L-1} P_{m,l'} + N_m\right). \quad (24)$$

Finally, note that rearranging Equation (23) yields a total rate expression $$\sum_{l=0}^{L-1} \frac{1}{2}\log(1+\rho_{m,l}) = \frac{1}{2}\log\left(1+\frac{P}{N_m}\right). \quad (25)$$

that generalizes Equation (9). Substituting Equations (19) and (20) into Equation (25), $N_m$ is obtained from the nonlinear equation $$\frac{1}{2}\log\left(1+\frac{P}{N_m}\right) = \sum_{l=0}^{L-1}\frac{1}{2}\log\left[1+\left(\rho-\sum_{m'=0}^{m-1}\frac{P_{m',l}}{\sum_{l'=l+1}^{L-1}P_{m',l'}+N_m}\right)\right]. \quad (26)$$

To verify that there is a unique solution, the following bounds are found on $N_m$:

$$N_{m-1} < N_m < \frac{P}{2^{2LR_O/(m+1)}-1}. \quad (27)$$

In Equation (27), $N_m > N_{m-1}$, as the right hand side becomes 0 for $N_m = N_{m-1}$. Otherwise, sufficient SNR would have been achieved by block m−1 to reach the threshold for decoding. Furthermore, the upper bound is the noise threshold for the case when we have a capacity-achieving code. Since our code is less efficient, a larger SNR is necessary to decode by block m.

Note that for the values of $N_m$ in range of Equation (27), the left hand side of Equation (26) is a monotonically decreasing function of $N_m$ and the right hand side is a monotonically increasing function of $N_m$. A search technique starting from the upper and lower bounds converges to the unique solution.

IV. Performance Losses Due to Imperfect Codes

The following section examines the SNR gap to capacity as a function of the number of layers, the number of redundancy blocks, and the choice of power allocation. The results in the following section are computed using an exemplary base code having a rate ⅙ CCSDS turbo code using a block size of 16384 information bits, including a 32-bit CRC (see, for example, Consultative Committee for Space Data Systems, "Recommendations for Space Data System Standards. Telemetry Channel Coding". CCSDS 101.0-B-4. Blue Book. May 1999).

Figure 6:
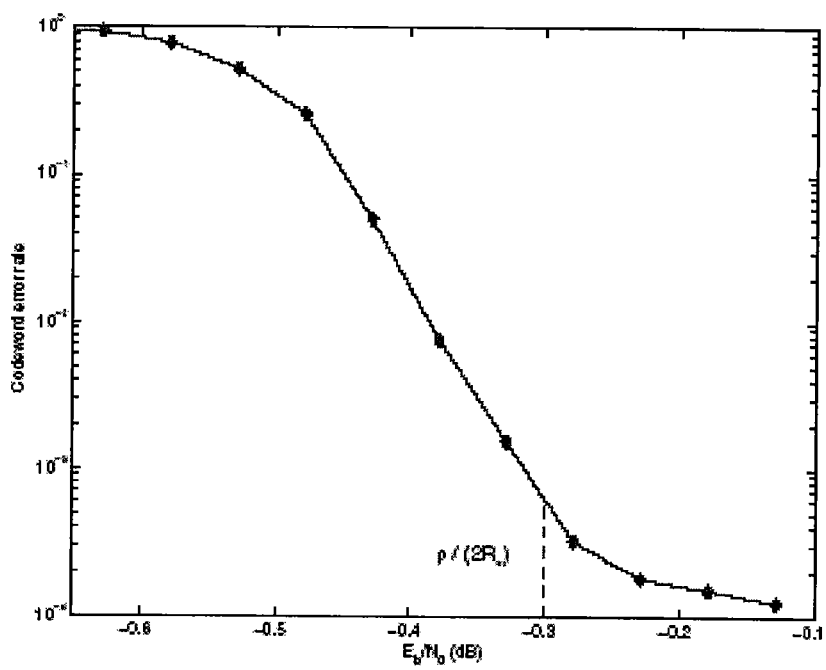
FIG. 6 depicts a word error rate performance curve for an exemplary base code according to an embodiment of the invention.

FIG. 6 depicts a word error rate performance curve for the base code described above. In FIG. 6, the word error rate performance curve exhibits an error floor at a word error rate of about $10^{-4}$. Further, the SNR threshold ρ (normalized by $2R_0$) is indicated by the dashed line at $E_b/N_0$=−0.3 dB, which is 0.78 dB from capacity (the particular value of ρ was selected by empirically optimizing over the block error performance for the rateless code for multiple blocks). Although there have been more efficient codes reported in the literature, the performance depicted in FIG. 6 is representative of the practically implementable codes currently used in practice.

A. Effect of Power Allocation on Gap to Capacity

The power allocation that results when assuming that the base code achieves capacity is given in Table I. The optimal power allocation, taking into account that the code decodes with $E_b/N_0$=−0.3 dB, is given in Table II. In both cases, the power allocation approaches equal power with increasing numbers of layers, but for the power allocation optimized for the particular code, more power is allocated initially to Layer 0.

Figure 7:
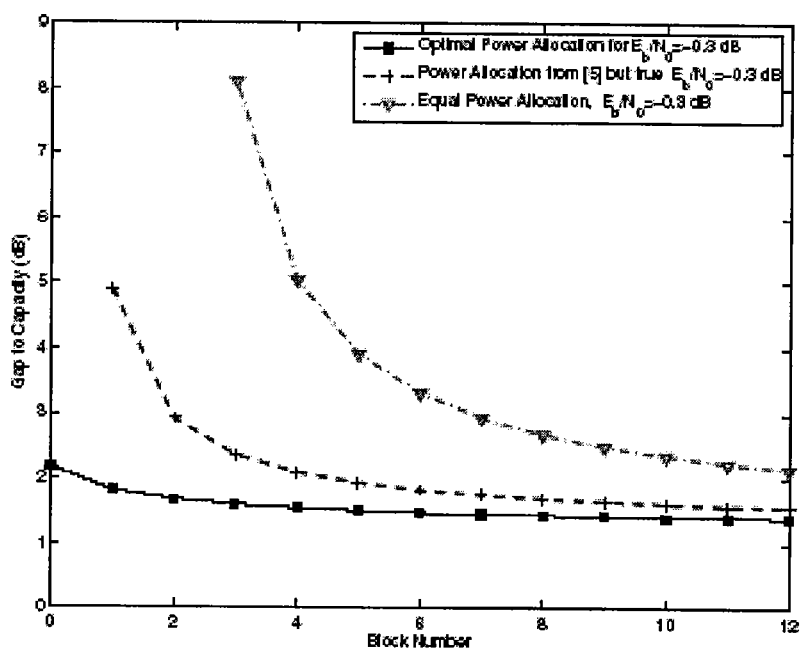
FIG. 7 illustrates a signal-to-noise (SNR) gap to capacity as a function of a number of blocks for an exemplary base code under various conditions according to an embodiment of the invention.

FIG. 7 depicts three curves that illustrate the SNR gap to capacity as a function of the number of blocks under the following three conditions: (i) the power allocation is optimized for a decoding threshold of $E_b/N_0$=−0.3 dB; (ii) the power allocation is for the capacity achieving code, that, in reality has a decoding threshold of $E_b/N_0$=−0.3 dB; and (iii) equal power of P/12 at each layer and a decoding threshold of $E_b/N_0$=−0.3 dB. Note that even in the absence of noise and using the power allocation of Erez, et al. (described above), Block 0 cannot decode. Similarly, the equal power case does not decode until Block 2, even under zero noise conditions.

Although the SNR gap-to-capacity curve for the optimal power allocation indicates that the optimal power allocation 2.18 dB from capacity at Block 0, the gap improves to 1.4 dB from capacity by Block 12.

TABLE 1

OPTIMAL POWER ALLOCATION FOR CAPACITY ACHIEVING CODE WITH QPSK. $R_o$ = 1/6, 12 LEVELS, 6 BLOCKS

| Layer | Block | | | | | | |
|---|---|---|---|---|---|---|---|
| | 0 | 1 | 2 | 3 | 4 | 5 | 6 |
| 0 | 0.220 | 0.066 | 0.078 | 0.081 | 0.082 | 0.082 | 0.083 |
| 1 | 0.175 | 0.074 | 0.083 | 0.084 | 0.084 | 0.084 | 0.084 |
| 2 | 0.139 | 0.082 | 0.086 | 0.085 | 0.085 | 0.084 | 0.084 |
| 3 | 0.110 | 0.089 | 0.088 | 0.086 | 0.085 | 0.085 | 0.084 |
| 4 | 0.087 | 0.093 | 0.089 | 0.086 | 0.085 | 0.084 | 0.084 |
| 5 | 0.069 | 0.096 | 0.088 | 0.085 | 0.084 | 0.084 | 0.084 |
| 6 | 0.065 | 0.096 | 0.086 | 0.084 | 0.084 | 0.084 | 0.084 |
| 7 | 0.044 | 0.093 | 0.085 | 0.084 | 0.083 | 0.083 | 0.083 |
| 8 | 0.035 | 0.089 | 0.083 | 0.083 | 0.083 | 0.083 | 0.083 |
| 9 | 0.028 | 0.082 | 0.081 | 0.082 | 0.082 | 0.083 | 0.083 |
| 10 | 0.022 | 0.074 | 0.078 | 0.081 | 0.082 | 0.082 | 0.083 |
| 11 | 0.017 | 0.066 | 0.076 | 0.080 | 0.081 | 0.082 | 0.082 |

TABLE 11

OPTIMAL POWER ALLOCATION FOR BASE CODE SNR THRESHOLD $E_b/N_O$ = −0.3 DB, 12 LEVELS, 6 BLOCKS.

| Layer | Block | | | | | | |
|---|---|---|---|---|---|---|---|
| | 0 | 1 | 2 | 3 | 4 | 5 | 6 |
| 0 | 0.247 | 0.066 | 0.079 | 0.082 | 0.083 | 0.083 | 0.083 |
| 1 | 0.188 | 0.076 | 0.085 | 0.086 | 0.085 | 0.085 | 0.085 |
| 2 | 0.144 | 0.086 | 0.089 | 0.088 | 0.086 | 0.085 | 0.085 |
| 3 | 0.110 | 0.094 | 0.091 | 0.088 | 0.086 | 0.085 | 0.085 |
| 4 | 0.084 | 0.099 | 0.091 | 0.087 | 0.086 | 0.085 | 0.084 |
| 5 | 0.064 | 0.101 | 0.090 | 0.086 | 0.085 | 0.084 | 0.084 |
| 6 | 0.049 | 0.099 | 0.087 | 0.084 | 0.084 | 0.084 | 0.083 |
| 7 | 0.037 | 0.094 | 0.084 | 0.083 | 0.083 | 0.083 | 0.083 |
| 8 | 0.028 | 0.086 | 0.081 | 0.081 | 0.082 | 0.082 | 0.083 |
| 9 | 0.022 | 0.076 | 0.078 | 0.080 | 0.081 | 0.082 | 0.082 |
| 10 | 0.016 | 0.066 | 0.074 | 0.078 | 0.080 | 0.081 | 0.082 |
| 11 | 0.013 | 0.056 | 0.071 | 0.076 | 0.079 | 0.080 | 0.081 |

B. Effect of Number of Layers on Gap to Capacity

Figure 8:
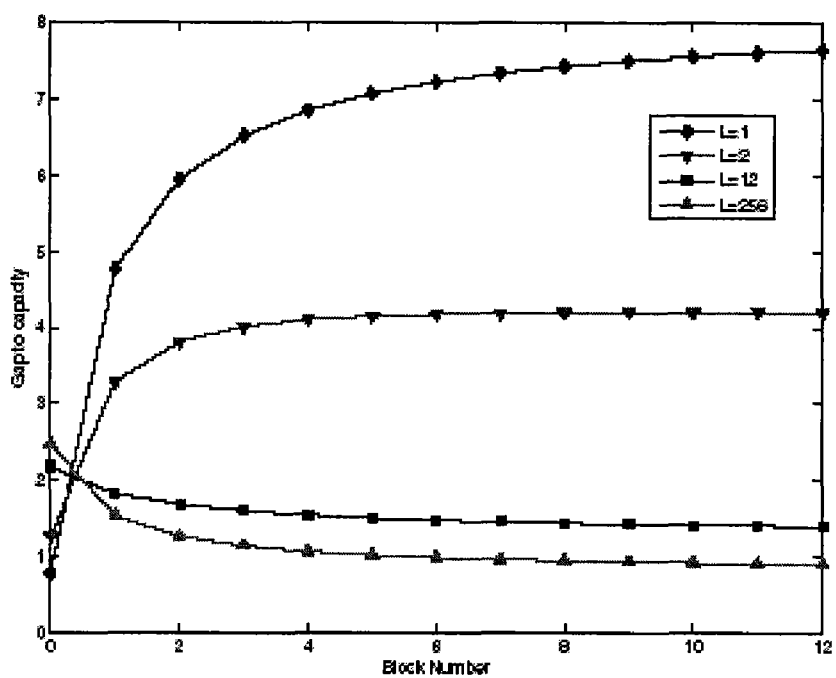
FIG. 8 illustrates a gap to capacity as a function of a number of blocks for an exemplary, layered rateless coding system.

As described above, the gap to capacity of the initial block increases monotonically with the number of layers L. The following section examines the total effect of suboptimal coding and combining by considering an empirical example. FIG. 8 depicts gap to capacity as a function of a number of blocks for a layered rateless coding system with Δ=0.78 dB, which corresponding to the rate 1/6 CCSDS code described above, and R=4 b/s/Hz using a QPSK constellation. The results of FIG. 8 have been determined using the iterative computation of the optimal power allocation outlined above with respect to FIGS. 3-5. Each curve corresponds to a different number of layers L. Although not depicted in FIG. 8, the same computations for optimal power allocation have been performed for several values of A and R, and the same general trends are observed as in the representative case of FIG. 8.

In FIG. 8, the gap increases with L for m=0, as expected. Notably, for all m>0, the behavior inverts and the gap decreases with L, reaching a limiting value for large m. As m→∞ the channel noise will dominate the interference for all of the layers, and the effect of interference can be ignored when computing SNR. It follows that an equal power allocation for all of the blocks will provide optimal performance for m, a fact illustrated in FIG. 7. MRC for equal power allocation will yield a combined single-layer SNR of $\rho=(m+1)P/(LN_m)$, which yields a channel SNR of $P/N_m = L\rho/(m+1)$. Taking the ratio of this channel SNR to that of a capacity-achieving code yields the gap to capacity $$\Delta_{m,L} = \frac{L\rho}{(m+1)((1+\rho/\Delta)^{L/(m+1)} - 1)}.$$

In the limit of large m and using Equation (10):

$$\lim_{m \to \infty} \Delta_{m,L} = \frac{\Delta(2^{2R/L} - 1)}{2R/L\ln 2}. \tag{28}$$

The limit of Equation (28) as L→∞ is Δ, the gap to capacity of the base code.

There is no clear objective function that one should select to determine an optimal L. A logical choice for an objective function is a weighted sum of gaps to capacity for several blocks m=1, 2, . . . , M for some M>1. It is difficult to develop an analytical solution to such an optimization, because the determination of performance is based on a recursive formulation and solutions to transcendental equations. A numerical solution for an optimal L should be straightforward.

V. Simulation Results

The following section outlines the simulation of an actual layered rateless coding system using a rate-⅙ CCSDS turbo code for a base code with QPSK modulation and L=12 layers, which resulting in a maximum throughput of 4 bits/sec/Hz for the Block 0 code.

Figure 9:
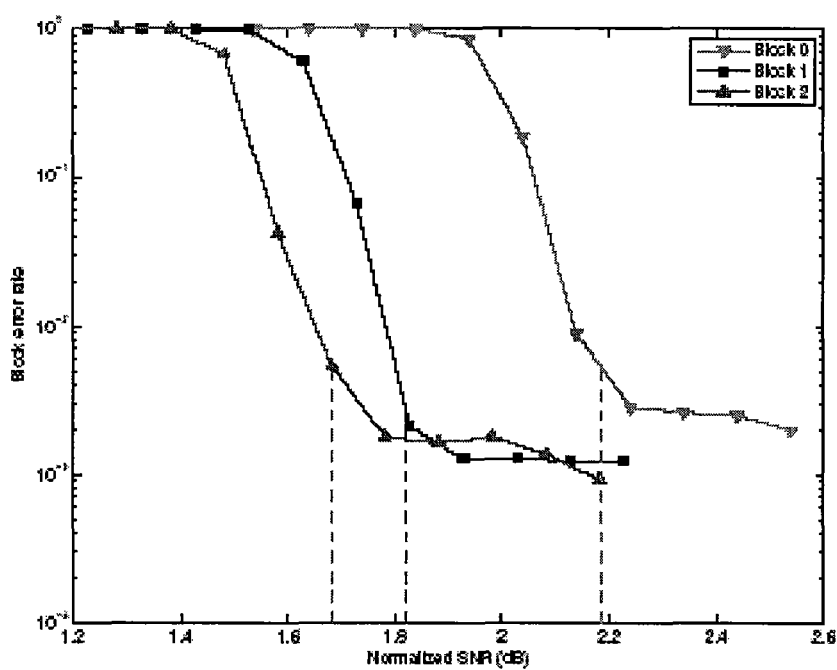
FIG. 9 depicts block error rate curves for several blocks of the exemplary, rateless code.

The AWGN channel around the SNR thresholds for Block 0, Block 1 and Block 2 have been simulated using the optimal power allocation described above. FIG. 9 plots block error rate curves for Blocks 0, 1, and 2, and the curves are plotted with respect to normalized SNR, $SNR_{norm}=SNR/(2^{2R(m+1)}-1)$. Thus, capacity for each curve is at 0 dB. FIG. 9 depicts, using dashed lines, the SNR thresholds $P/N_m$ for each block m as computed by the power allocation algorithm described above, and the SNR thresholds $P/N_m$ for each block m are in good agreement with the corresponding performance curve. Because capacity is at 0 dB, these SNR thresholds expressed as $SNR_{norm}$ equal the gaps to capacity corresponding to the first three points of the L=12 curve in FIG. 8.

In FIG. 9, the error floor for the block error rate for all cases is about $10^{-3}$, which is approximately L=12 times higher than the error floor for the base code. This error floor is in line with predicted behavior, because a block must decode L consecutive base codewords in order to decode.

Exemplary Computer Systems

Figure 10:
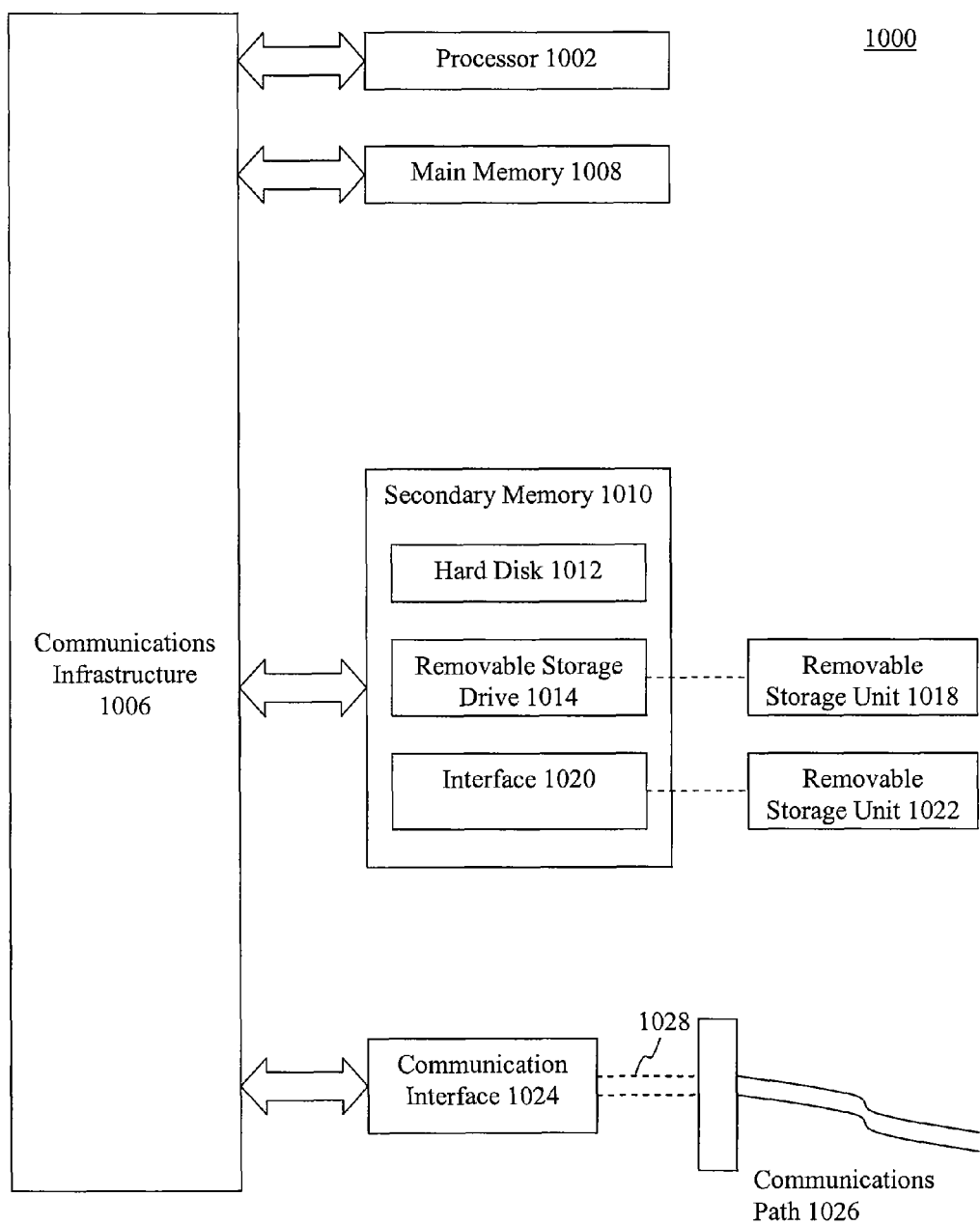
FIG. 10 depicts an exemplary computer architecture upon which embodiments of the present invention may be implemented in accordance with an embodiment of the invention.

FIG. 10 is an exemplary computer architecture 1000 upon which the methods, systems, and computer program products of the present invention may be implemented, according to an embodiment of the invention. Exemplary computer system 1000 includes one or more processors, such as processor 1002. The processor 1002 is connected to a communication infrastructure 1006, such as a bus or network. Various example software implementations are described in terms of this exemplary computer system. After reading this description, it will become apparent to a person skilled in the relevant art how to implement the invention using other computer systems and/or computer architectures.

Computer system 1000 also includes a main memory 1008, preferably random access memory (RAM), and may include a secondary memory 1010. The secondary memory 1010 may include, for example, a hard disk drive 1012 and/or a removable storage drive 1014, representing a magnetic tape drive, an optical disk drive, CD/DVD drive, etc. The removable storage drive 1014 reads from and/or writes to a removable storage unit 1018 in a well-known manner. Removable storage unit 1018 represents a magnetic tape, optical disk, or other storage medium that is read by and written to by removable storage drive 1014. As will be appreciated, the removable storage unit 1018 can include a computer usable storage medium having stored therein computer software and/or data.

In alternative implementations, secondary memory 1010 may include other means for allowing computer programs or other instructions to be loaded into computer system 1000. Such means may include, for example, a removable storage unit 1022 and an interface 1020. An example of such means may include a removable memory chip (such as an EPROM, or PROM) and associated socket, or other removable storage units 1022 and interfaces 1020, which allow software and data to be transferred from the removable storage unit 1022 to computer system 1000.

Computer system 1000 may also include one or more communications interfaces, such as communications interface 1024. Communications interface 1024 allows software and data to be transferred between computer system 1000 and external devices. Examples of communications interface 1024 may include a modem, a network interface (such as an Ethernet card), a communications port, a PCMCIA slot and card, etc. Software and data transferred via communications interface 1024 are in the form of signals 1028, which may be electronic, electromagnetic, optical or other signals capable of being received by communications interface 1024. These signals 1028 are provided to communications interface 1024 via a communications path (i.e., channel) 1026. This channel 1026 carries signals 1028 and may be implemented using wire or cable, fiber optics, an RF link and other communications channels. In an embodiment of the invention, signals 1028 comprise data packets sent to processor 1002. Information representing processed packets can also be sent in the form of signals 1028 from processor 1002 through communications path 1026.

The terms "computer program medium" and "computer usable medium" are used to refer generally to media such as removable storage units 1018 and 1022, a hard disk installed in hard disk drive 1012, and signals 1028, which provide software to the computer system 1000.

Computer programs are stored in main memory 1008 and/or secondary memory 1010. Computer programs may also be received via communications interface 1024. Such computer programs, when executed, enable the computer system 1000 to implement the present invention as discussed herein. In particular, the computer programs, when executed, enable the processor 1002 to implement the present invention. Where the invention is implemented using software, the software may be stored in a computer program product and loaded into computer system 1000 using removable storage drive 1014, hard drive 1012 or communications interface 1024.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of computing a power allocation for a rateless, error-correcting code constructed from a plurality of repeated blocks having a plurality of superimposed layers and having a decoding signal-to-noise ratio (SNR) threshold, comprising:
   determining a noise threshold for an initial block based on at least the SNR threshold;
   calculating a power allocation for each layer of the initial block based on the determined noise threshold; and
   allocating power to each layer of a block proximate to the initial block such that each layer of the proximate block has an effective SNR equivalent to the SNR threshold; and
   repeating the allocating step for each of the plurality of repeated blocks subsequent to the initial block to allocate power to each layer of the plurality of repeated blocks.

2. The method of claim 1, wherein the calculated power allocation ensures that each layer of the initial block experiences the SNR threshold.

3. The method of claim 1, wherein the allocating step comprises:
   (i) identifying an upper and a lower bound on noise threshold for the proximate block; and
   (ii) iteratively determining a noise threshold and a power allocation for the proximate block by searching between the identified upper and lower bounds.

4. The method of claim 3, wherein the upper bound represents a noise threshold for a capacity-achieving code, and wherein the lower bound represents a noise threshold for an proximate, lower block.

5. The method of claim 3, wherein step (ii) further comprises computing a residual SNR for each layer of the proximate block.

6. The method of claim 5, wherein the computing step further comprises subtracting the residual SNR from the SNR threshold to determine the effective SNR for each layer of the proximate block.

7. The method of claim 3, wherein step (ii) comprises:
   allocating power to an upper layer of the proximate block based on the noise threshold of the proximate block and an effective SNR of the upper layer of the proximate block; and
   recursively calculating the power allocation for each layer of the proximate block below the upper layer.

8. The method of claim 1, wherein the calculating step comprises:
   allocating power to an upper layer of the initial block using the noise threshold of the initial block and the SNR threshold; and
   recursively calculating the power allocation for each layer of the initial block below the upper layer.

9. The method of claim 8, wherein the allocating step comprises computing a product of the noise threshold for the initial block and the SNR threshold.

10. The method of claim 1, further comprising computing a log-likelihood ratio of a coded bit of information at each layer of each block of the plurality of blocks.

11. A system of computing a power allocation for a rateless, error-correcting code constructed from a plurality of repeated blocks having a plurality of superimposed layers and having a decoding signal-to-noise ratio (SNR) threshold, comprising:
   means for determining a noise threshold of an initial block based on at least the SNR threshold;
   means for calculating a power allocation for each layer of the initial block based on the noise threshold; and
   means for allocating power to each layer of a block proximate to the initial block such that each layer of the proximate block has an effective SNR equivalent to the SNR threshold,
   wherein the means for allocating is applied to each of the plurality of repeated blocks subsequent to the initial block to allocate power to each layer of the plurality of repeated blocks.

12. The system of claim 11, wherein the calculated power allocation ensures that each layer of the initial block experiences the SNR threshold.

13. The system of claim 11, wherein the means for allocating comprises:
   (i) means for identifying an upper and a lower bound on noise threshold for the proximate block; and
   (ii) means for iteratively determining a noise threshold and a power allocation for the proximate block by searching between the identified upper and lower bounds.

14. The system of claim 13, wherein the upper bound represents a noise threshold for a capacity-achieving code, and wherein the lower bound represents a noise threshold for an proximate, lower block.

15. The system of claim 13, wherein the means for iteratively determining a noise threshold and a power allocation comprises means for computing a residual SNR for each layer of the proximate block.

16. The system of claim 15, wherein the means for computing comprises means for subtracting the residual SNR from the SNR threshold to determine the effective SNR for each layer of the proximate block.

17. The system of claim 13, wherein the means for determining a noise threshold and a power allocation comprises:
   means for allocating power to an upper layer of the proximate block based on the noise threshold of the proximate block and an effective SNR of the upper layer of the proximate block; and
   means for recursively calculating the power allocation for each layer of the proximate block below the upper layer.

18. The system of claim 11, wherein the means for calculating comprises:
   means for allocating power to an upper layer of the initial block using the noise threshold for the initial block and the SNR threshold; and
   means for recursively calculating the power allocation for each layer of the initial block below the upper layer.

19. The system of claim 18, wherein the means for allocating comprises means for computing a product of the determined noise threshold for the initial block and the SNR threshold.

20. The system of claim 11, further comprising computing a log-likelihood ratio of a coded bit of information at each layer of each block of the plurality of blocks.

21. The system of claim 11, further comprising:
   a transmitter and a receiver, wherein the transmitter and receiver are configured to operate according to a protocol utilizing the power allocated to each layer of each of the repeated blocks.

22. A computer program product comprising a computer usable medium having control logic stored therein for causing a processor to compute a power allocation for a rateless, error-correcting code constructed from a plurality of repeated blocks having a plurality of superimposed layers and having a decoding signal-to-noise ratio (SNR) threshold, the control logic comprising:

first computer readable program code means for causing a processor to determine a noise threshold for an initial block based on at least the SNR threshold;

second computer readable program code means for causing a processor to calculate a power allocation for each layer of the initial block based on the noise threshold; and third computer readable program code means for causing a processor to allocate power to each layer of a block proximate to the initial block such that each layer of the proximate block has an effective SNR equivalent to the SNR threshold, wherein the third computer readable program code means is applied to each of the plurality of repeated blocks subsequent to the initial block to allocate power to each layer of the plurality of repeated blocks.

23. The computer program product of claim 22, wherein the calculated power allocation ensures that each layer of the initial block experiences the SNR threshold.

24. The computer program product of claim 22, wherein the third computer readable program code means comprises:

(i) fourth computer readable program code means for causing a processor to identify an upper and a lower bound on noise threshold for the proximate block; and (ii) fifth computer readable program code means for causing a processor to iteratively determine a noise threshold and a power allocation for the proximate block by searching between the identified upper and lower bounds.

25. The computer program product of claim 24, wherein the upper bound represents a noise threshold for a capacity-achieving code, and wherein the lower bound represents a noise threshold for an proximate, lower block.

26. The computer program product of claim 24, wherein the third computer readable program code means comprises:

sixth computer readable program code means for causing a processor to compute a residual SNR for each layer of the proximate block.

27. The method of claim 26, wherein the sixth computer readable program code means comprises:

seventh computer readable program code means for causing a processor to subtract the residual SNR for the proximate block from the SNR threshold to determine the effective SNR for each layer of the proximate block.

28. The method of claim 24, wherein the third computer readable program code means comprises:

sixth computer readable program code means for causing a processor to allocate power to an upper layer of the proximate block based on the noise threshold of the proximate block and an effective SNR for the upper layer of the proximate block; and seventh computer readable program code means for causing a processor to recursively calculate the power allocation for each layer of the proximate block below the upper layer.

29. The computer program product of claim 22, wherein second computer readable program code means comprises:

fourth computer readable program code means for causing a processor to allocate power to an upper layer of the initial block using the noise threshold of the initial block and the SNR threshold; and fifth computer readable program code means for causing a processor to recursively calculate the power allocation for each layer of the initial block below the upper layer.

30. The computer program product of claim 29, wherein the third computer readable program code means comprises:

sixth computer readable program code means for causing a processor to compute a product of the noise threshold of the initial block and the SNR threshold.

31. The method of claim 22, further comprising:

fourth computer readable program code means for causing a processor to compute a log-likelihood ratio of a coded bit of information at each layer of each block of the plurality of blocks.

* * * * *